United States Patent [19]

Cipolla et al.

[11] Patent Number: 5,337,218
[45] Date of Patent: Aug. 9, 1994

[54] CIRCUIT CARD INTERCONNECTING STRUCTURE

[75] Inventors: Thomas M. Cipolla, Katonah; Paul W. Coteus, Yorktown Heights, both of N.Y.

[73] Assignee: International Business Machines Corporation, Armonk, N.Y.

[21] Appl. No.: 892,075

[22] Filed: Jun. 2, 1992

[51] Int. Cl.⁵ .......................................... H01R 23/68
[52] U.S. Cl. .................................... 361/785; 29/872; 361/796; 439/325
[58] Field of Search ................. 361/412–415, 361/784, 785, 752, 796; 439/61, 65, 69, 75, 79, 59, 329, 74, 325, 329, 331; 24/872

[56] References Cited

U.S. PATENT DOCUMENTS

| | | | |
|---|---|---|---|
| 3,289,141 | 11/1966 | White | 439/74 |
| 3,701,964 | 10/1972 | Cronin | 361/412 X |
| 3,904,934 | 9/1975 | Martin | 439/74 |
| 3,992,653 | 11/1976 | Richardson et al. | 317/100 |
| 4,542,441 | 9/1985 | Perretta | 361/412 |
| 4,602,317 | 7/1986 | Rovnyak et al. | 439/329 X |
| 4,834,660 | 5/1989 | Cotti | 439/67 |

OTHER PUBLICATIONS

Tsui et al. IBM Technical Disclosure Bulletin vol. 13 No. 6 Nov. 1970 pp. 1411–1412.

Primary Examiner—Eugene F. Desmond
Attorney, Agent, or Firm—Daniel P. Morris; Alvin J. Riddles

[57] ABSTRACT

An interconnecting structure in which circuit and componentry bearing cards are retained in contact with an intermediate card that has component and circuitry areas, and socket insertion contacts.

13 Claims, 5 Drawing Sheets

CIRCUIT CARD INTERCONNECTING STRUCTURE

FIELD OF THE INVENTION

The invention relates to the interconnection of circuit and component subassemblies into electronic apparatus and in particular to a structure for interconnecting circuit and component printed circuit cards into a high density assembly.

BACKGROUND OF THE INVENTION

As component densities and signal rates increase, it has become of importance to arrange the circuitry into as dense a structure as possible while still retaining ability to conduct repair and maintenance operations. There has developed in the art a structural system wherein the components, such as integrated circuit devices, are mounted on generally insulating planar members with printed wiring interconnecting the component terminals and with terminals along an edge of the planar member. The component and printed wiring bearing planar members have become known in the art by such terms as boards, modules and cards. For consistency, the term card will be used. These cards are both rigid and flexible. The edge of the card, in turn, fits into a socket that makes an electrical interconnection between each terminal along the edge of the card and external circuitry in the overall electronic apparatus so that the cards are parallel to each other and perpendicular to the socket.

Progress in the art is encountering several interrelated limitations. As component density and capability increase, the number of terminals on the edge of the card increases which results in closer spacing. The sockets into which the edges of the card fit must be strong enough to support the card and do it with electrically reliable contact on each terminal which results in socket structural limits on both the number of contacts on a card edge and the closeness of the cards. As component capability increases, it becomes necessary to combine several cards into an overall electrical function and when this is done, fan-out wiring or combinatorial switching or logic circuitry is needed.

There has been some progress in the art on a portion of the limitations. The high density contacting limitation has been addressed through the zero insertion force technique wherein in essence a separate force from the insertion force supplies the contact pressure. One example of such a structure is shown in U.S. Pat. No. 3,992,653 wherein cam actuated lateral pressure is applied after card insertion. Another example is shown in U.S. Pat. No. 4,834,660 wherein the contacts on the card edge extend around a resilient member on the card edge and contact pressure is applied through bolts that pull the contacts and the socket together.

SUMMARY OF THE INVENTION

The invention provides an interconnecting structural principle wherein an intermediate card having contacts along one edge and contacts, that may be at a different spacing, along the other edge, is positioned between one or more cards and the socket. Pressure is provided compressing the combination together. The structure provides the ability to change spacing of contacts between the card spacing and the socket spacing and the ability to provide fan-out circuitry and logic componentry on the intermediate card. Serial combinations of intermediate cards permit combining multiple pairs of cards. Zero insertion force reliable electrical connection is achieved with substantially orthogonal wiping, compression and retention forces.

DESCRIPTION OF THE PREFERRED EMBODIMENTS OF THE INVENTION

Figure 1:
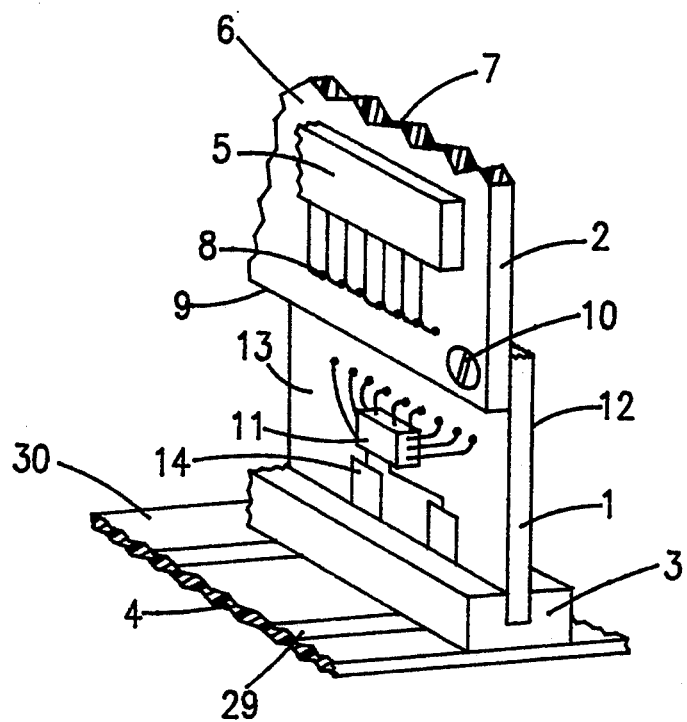
FIG. 1 is a schematic perspective view of the relative positioning of the intermediate card with respect to the card and the socket.

In FIG. 1 there is illustrated, in a schematic perspective view, the relative positioning of the elements of the invention in a single and intermediate card embodiment. The intermediate card 1 is positioned between a standard componentry and circuit bearing card 2 and external wiring involving as an example a socket 3 which in turn is connected to a wiring bearing substrate 4. The single card 2 is typical of the cards available in the art wherein componentry 5 is positioned on one or both faces 6 and 7, generally interwired by printed wiring with a row of contacts along the edge of the card. The density of componentry and circuitry on the card results in very close spacing of the contacts along the edge. In FIG. 1 the conductors 8 from the component 5 would go through the card to a very closely spaced row of contacts out of view along the edge 9 in contact with a corresponding row of contacts on the intermediate card 1. The rows of contacts are interrupted by a retention member 10 illustrated as a bolt of which there may be several along the line of contacts and which serve to hold the cards 1 and 2 together.

The invention through the intermediate card 1 provides space for componentry and circuitry 11 on faces 12 and 13 which in turn permits a change in spacing of contacts 14 to the socket 3 and further in turn to the external wiring element 4. The ability to change the spacing between the contact spacing on the card 2 and the spacing in the socket 3 provides advantages in packaging of card assemblies to provide complete functions.

Figure 2:
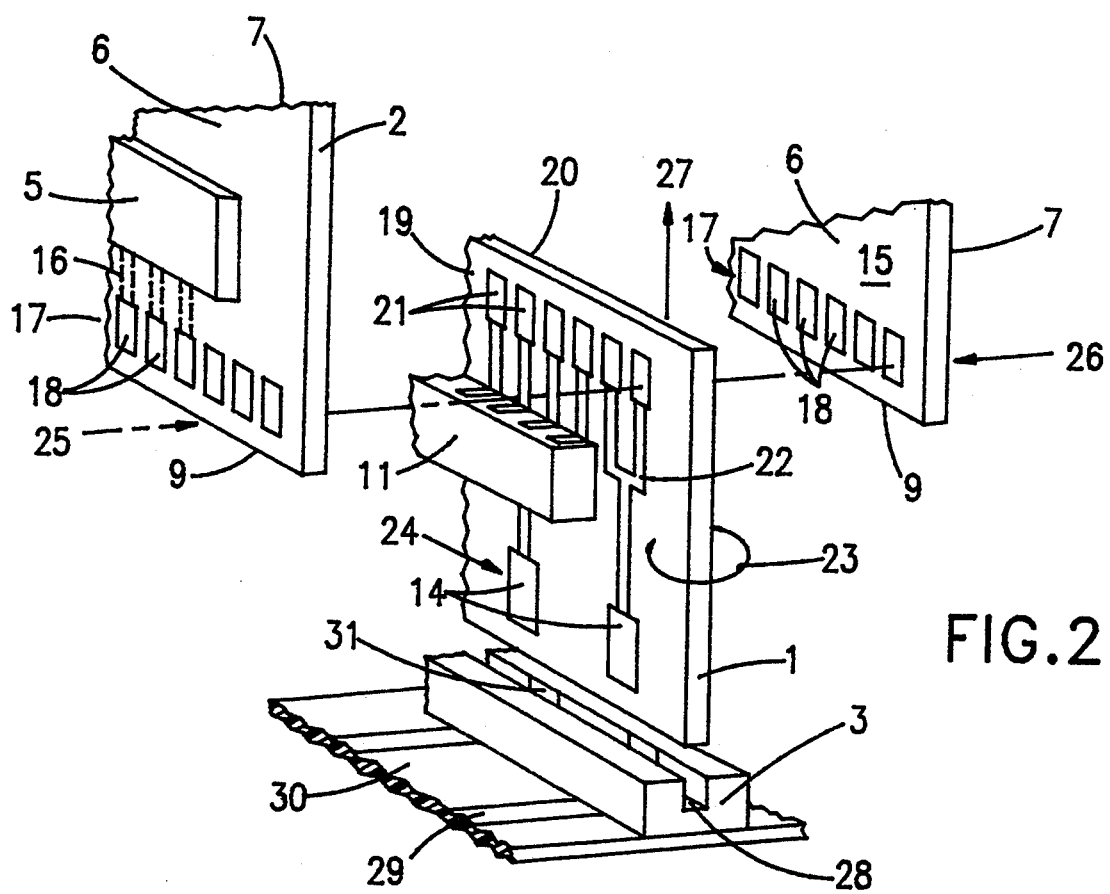
FIG. 2 is an exploded perspective view of portions of an assembly of two cards with an intermediate card illustrating the principles of the invention.

In FIG. 2, using the same reference numerals, the principle of the invention is extended to an assembly of two cards with the intermediate card between them.

In FIG. 2 there is shown an exploded perspective view of the elements of the intermediate card assembly of the invention wherein the intermediate card 1 is positioned between cards 2 and 15. Cards 2 and 15 are the type of electronic circuitry cards standard in the art wherein components such as is illustrated by element 5 are mounted on the surface areas 6 and 7 and are interconnected by printed wiring type conductors such as is illustrated by dotted element 16. Along the edge 9 of each card designed for insertion in a socket, a row 17 of contacts 18 for external electrical connection of the circuitry are provided. In practice, although not shown, where contacts such as 9 in row 8 are edge contacts, those contacts are frequently brought right to the edge of the card.

In accordance with the invention, in the embodiment illustrated, the cards 2 and 15 are arranged in an assembly on each side of the intermediate card 1 with the rows 17 of contacts 18 on each, contacting the rows 19 and 20 which are not visible, of contacts 21 on each side of the intermediate card 1. The intermediate card 1 has printed type wiring interconnecting componentry illustrated by element 11 and fan-out type circuitry illustrated by element 22 mounted in the areas 23 between the contact rows 19 and 20 and a row 24 of contacts 14 for socket or serial assembly connection. The spacing between contacts 21 in the rows 19 and 20 can be much different than the spacing between contacts 14 in row 24.

Cards, such as 2 and 15, have several, standard article of manufacture, features. The components, such as 5, are on one side of a planar insulating substrate member and a closely spaced row of contacts is along one edge for insertion into a long socket with a contact for each contact in the row. The rows of contacts can be on either side or both sides of the substrate member. There is a selection of contact types. Cards designed for memory and for switching or logic are standard in the art.

In FIG. 2, the cards 2 and 15 are positioned under pressure shown as arrows 25 and 26 on each side of the intermediate card 1 and, as the contacting takes place, motion, shown as arrow 27, in the orthogonal direction provides a wiping motion on the contacts 18, 20 and 21.

The edge of the intermediate card 1, adjacent the row 24 of contacts 14, enters slot 28 of example type socket 3 which in turn is connected to conductors 29 on substrate 30. The socket 3 has contacts 31 that correspond in spacing to the external wiring as represented by conductors 29. Socket 3 is illustrative only. There are many socket constructions in the industry.

Figure 3:
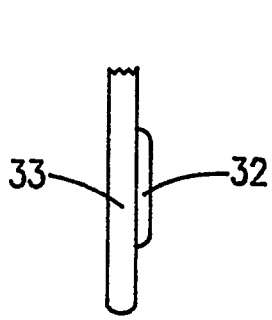
FIGS. 3, 4 and 5 are schematic cross sectional views of the types of contacts along the edges of cards.
Figure 4:
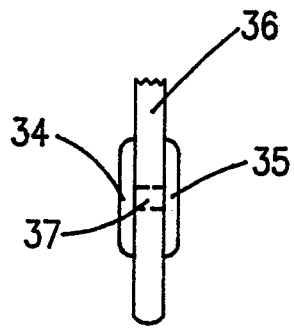
Figure 5:
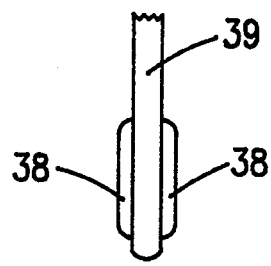

The contacts in the rows on the edges of the cards are of several general types. Referring to FIGS. 3, 4 and 5, schematic cross sectional views of three common types are illustrated. In FIG. 3, a single side contact 32 is shown on one side of a portion of a card 33. The contact 32 can be specified to be on either side of the card 33. It is constructed to extend above the surface, a normal attribute of top surface wiring. In FIG. 4, a double sided contact is shown wherein bump contacts 34 and 35 on opposite sides of a card 36 are at least electrically joined through a via 37 through the card. In FIG. 5, a double sided edge contact is shown where the independent, not connected conductive portions 38 are on each side of the card 39.

While circuit cards are general articles of commerce, available at this point in the art with the componentry on the individual card oriented predominately toward memory or logic, such detail as contact type, spacing and location can also be specified.

In the invention as illustrated in FIG. 2, for the contacts 18 in row 17 of cards 2 and 15, the type of FIGS. 3 or 4 would be used, whereas, for the double sided contacts 21 in rows 19 and 20 on the intermediate card 1 the type of FIGS. 4 and/or 5 would ordinarily be used. For contacts to be inserted into the socket 3 structure, such as contacts 14 in row 24 of intermediate card 1, any of the types of FIGS. 3, 4 or 5 could be used.

Figure 6:
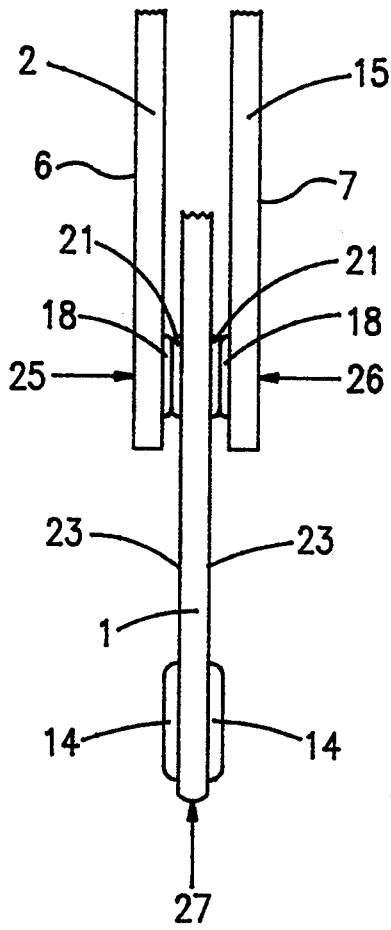
FIG. 6 is a schematic cross sectional view of a two card with the intermediate card, assembly of the invention.

Referring next to FIG. 6, a cross sectional view of the assembly of the invention as illustrated in FIG. 2 is shown employing the sa/ne reference numerals. The intermediate card 1 with contacts 14 along the edge that is to enter the socket 3, not shown in FIG. 6, is positioned between cards 2 and 15 with contacts 21 on each side of card 1 contacting contacts 18 on cards 2 and 15. The assembly is held in position by forces schematically illustrated as arrows 25 and 26 and for which bolts are satisfactory. During assembly, a force 27 is applied orthogonally to the pressure on the contacts 18 and 21 to provide a wiping motion.

In the assembly of the invention, one advantage is the saving of space between cards 2 and 15 so that the componentry, not shown in FIG. 6, would be on the external surfaces 6 and 7 of cards 2 and 15. On card 1, the componentry would be in area 23. Another advantage in the assembly of the invention would be, space permitting, that there be components on both sides of each card.

The assembly of the invention permits a more dense construction of cards, added flexibility in contact spacing between the spacing on the edges of the cards and the spacing in the socket, and, the ability to provide combinatorial fan-out and logic in combining cards. Frequently, heretofore in the art, where cards must be combined to achieve a function, additional cards must then be provided for the circuitry required to combine them.

The structural principle of the invention may be extended to serial combinations that permit further packing density and wiring flexibility advantages. An example of such serial combination is illustrated in FIG. 7 which is a schematic cross sectional view of the serial combining of the intermediate cards of two, two card with intermediate card, assemblies.

Figure 7:
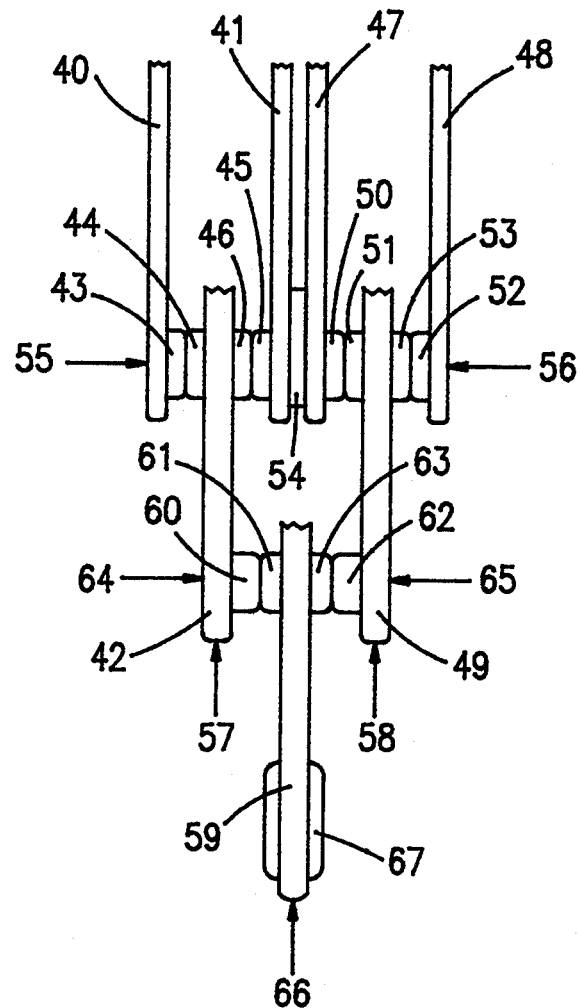
FIG. 7 is a schematic cross sectional view of a serial assembly of intermediate cards for multiple card pair combinations.

Referring to FIG. 7, the serial combination is illustrated. In FIG. 7, cards 40 and 41 are positioned on each side of intermediate card 42 and joined thereto at contacts 43 and 44, and, 45 and 46. Similarly, cards 47 and 48 are positioned on each side of intermediate card 49 and joined thereto at contacts 50 and 51, and, 52 and 53. A spacer 54 is provided between cards 41 and 47 to keep them apart and to distribute pressure as force, symbolically shown as arrows 55 and 56, is applied. In assembly, as the force from arrows 55 and 56 is applied, temporary wiping motion is provided at the contacts 43–46 and 50–53 through temporary forces 57 and 58 that are applied to the intermediate cards 42 and 49, respectively. Cards 41 and 42 could be assembled independent of cards 47, 48 and 49 and vice versa.

The intermediate cards 42 and 49 in turn are serially combined with intermediate card 59 and joined thereto at contacts 60 and 61, and, 62 and 63 where the contact row, shown as 17 in FIG. 2, of each of the intermediate cards 42 and 49 in FIG. 7 now serve as the contact row 19 of FIG. 2 to the intermediate card 59 in FIG. 7. The elements 42, 49 and 59 portion of the assembly is retained by force applied in the directions of arrows 64 and 65 with wiping provided by temporary force 66. The contacts 67 enter a socket such as 3 in FIGS. 1 and 2, not shown in this Figure. The serial assembly adds another stage of fan-out and switching capability, and another stage of contact spacing flexibility, between the socket and the cards.

Figure 8:
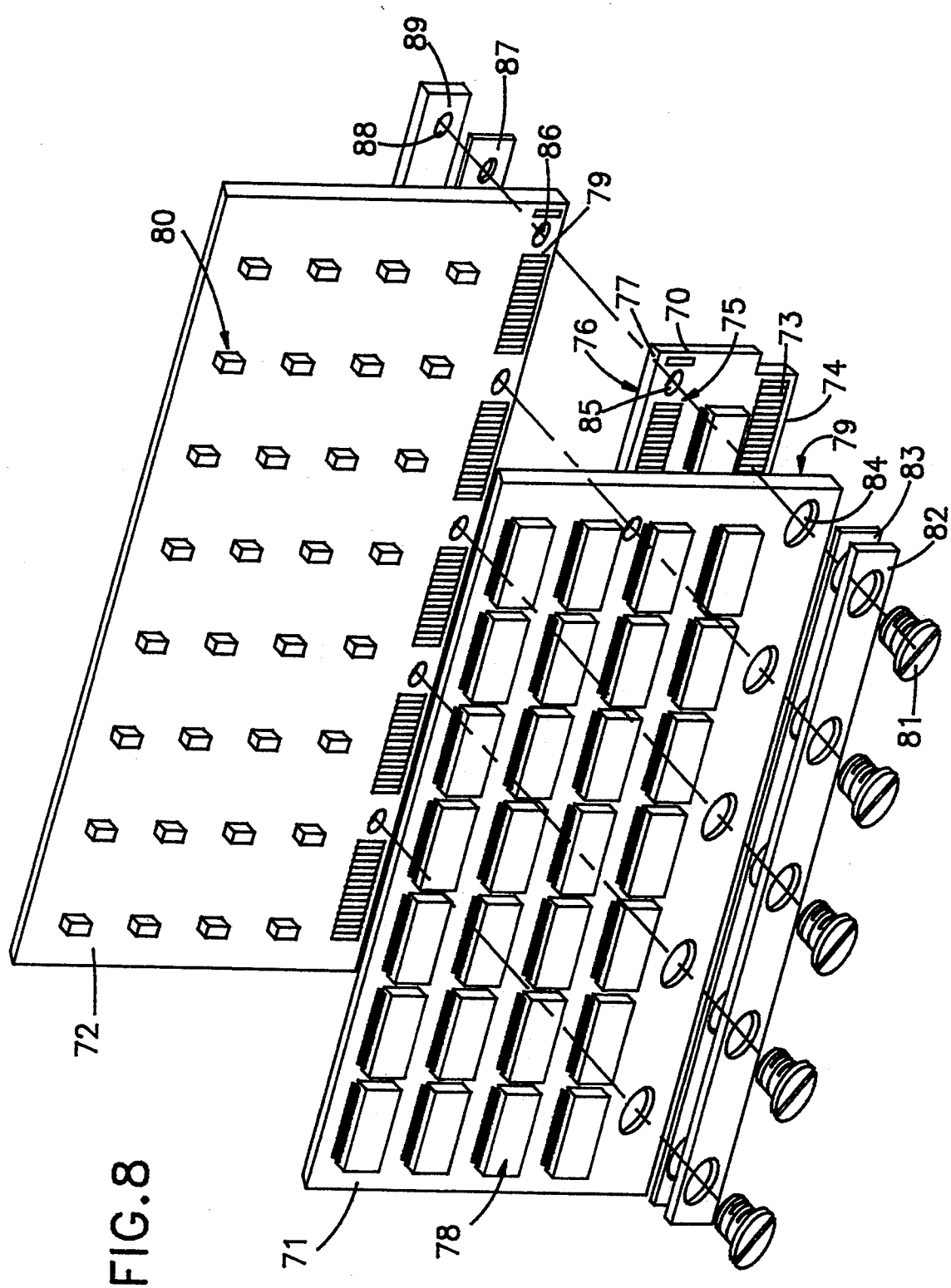
FIG. 8 is an exploded perspective view of a preferred embodiment assembly of the invention.

The invention is further illustrated in the form of a preferred embodiment in FIG. 8 which is an exploded perspective view of the structure of FIGS. 2 and 6 and in which the forces 25 and 26 in FIGS. 2 and 6 holding the cards 2 and 15 in contact with the intermediate card 1 are screws through the assembly.

Referring to FIG. 8, an intermediate card 70 is positioned between two component and circuitry bearing cards 71 and 72. The intermediate card 70 has a row of contacts 73 along an edge 74, that is to be inserted in a socket, not shown. The intermediate card 70 further has rows 75 and 76, out of view, of contacts along an edge 77 for connection to the cards. The contacts of the rows 75 and 76 correspond in type to the contacts 20 and 21 in FIGS. 2 and 6.

The cards 71 and 72 have components 78 on card 71 and out of view on card 72, on opposite sides for clearance purposes or on all sides, space permitting. Each card 71 and 72 has a row 79 of contacts, only the row on card 72 being visible, for connection to the intermediate card 70 contacts that are in rows 75 and 76. Spacers 80 of the type illustrated as element 44 in FIG. 7 may be provided to maintain parallelism of the cards.

The assembly of card 71, intermediate card 70 and card 72 is kept in position under compressive and retention forces using fastening members, such as screws 81 with a large head, the body of which passes serially through rail 82, stress distributing compliant material 83, clearance holes or slots 84, 85 and 86 in cards 71, 70 and 72, respectively, compliant material 87 and into threaded hole 88 in rail 89. The number and spacing of the screws 81 and the need for compliant material 83 is largely determined by the spacing of the contacts in the rows 75, 76 and 79 variation in thickness of cards and contacts, and the mechanical forces exerted in service.

In assembly, there is some flexibility and interdependence in the operations of compression, wipe and retention. The contacts should wipe while under some compression and before full retention force is applied. In accordance with the invention, the wiping force is applied separate from the compression and retention forces and in the orthogonal direction.

For example, as the screws are tightened, the clearance holes 84, 85 and 86 permit some wiping motion to be imparted to the contacts in rows 75, 76 and 79 through a motion imparting force, applied to card 70, as illustrated by element 27 of FIGS. 2 and 6.

It will be apparent within the principle of the invention that there will be considerable flexibility in substitution. As one example, in a packaging construction where the cards are maintained parallel in slots in a frame, the need for spacers 80 is reduced and placing components on both sides of the cards is facilitated. As another example, where the cards carry only circuitry or are nearly flush with the surface components, there would be no need for cards 71 and 72 to have components 78 on opposite sides for clearance purposes. Further, although intermediate card 70 is shown with edge 77 adjacent the contact rows 75 and 76, where there is no interference electrically or mechanically with the cards 71 and 72, the intermediate card can extend further and occupy more of the space between the cards.

In assembling the invention, it is of importance that reliable electrical contact to closely spaced contacts be established, and durably retained, throughout service. In accordance with the invention, the zero insertion force principle of having a wiping of the contacts at insertion with a lateral compressive force across the contact faces has been modified to provide separate orthogonal wiping and compressive forces during permanent fastening.

The principle is illustrated in connection with FIG. 9 which is a schematic cross sectional view of the assembly of FIG. 8 with apparatus employed in the assembly of the two cards in connecting the intermediate card between them.

Figure 9:
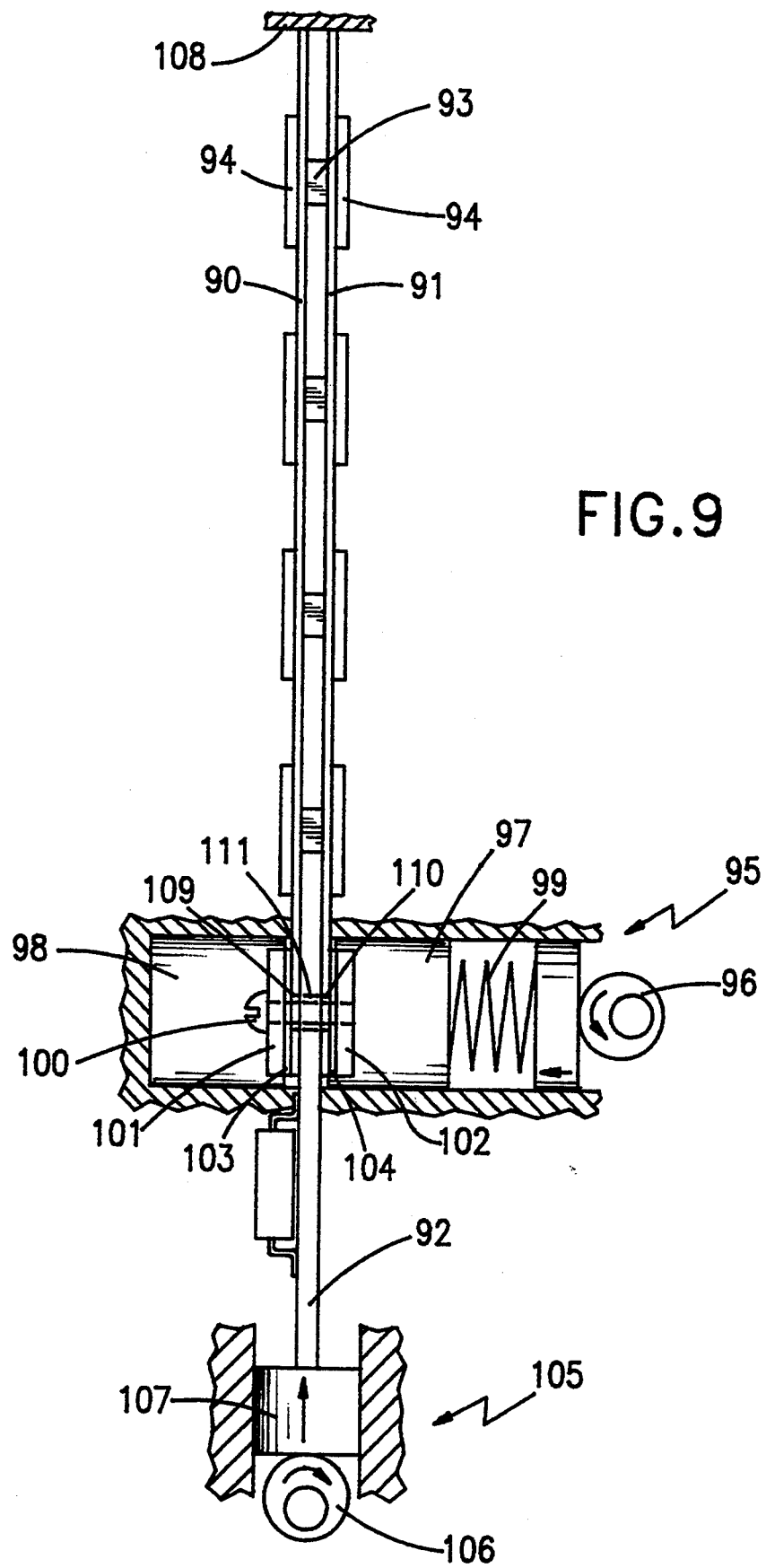
FIG. 9 is a schematic cross sectional view of the substantially orthogonal wiping, compression and retention force electrical connection reliability assembly.

Referring to FIG. 9, cards 90 and 91 are positioned on each side of intermediate card 92 with components or spacers 93 and with the componentry 94 on the external sides of the assembly. A pressure station 95 is provided to provide compressive forces across the contacts in rows 79 of the cards and 75 and 76 of the intermediate card. The pressure station 95 has a cam 96 that urges movable portion 97 toward a stationary portion 98 with compression forces limited by a spring coupling 99. The effect of the pressure station is to provide alignment and measured compressive force during tightening of screw 100 which draws rails 101 and 102 together with stress being substantially evenly distributed with compliant material members 103 and 104.

While the forces of station 95 are applied and before screw 100 is present or completely tightened, a wiping motion on the contacts is provided through a wiping motion station 105 which applies orthogonal direction motion to the contacts using a cam 106 to urge an anvil 107 against the edge of the intermediate card 92 while the motion of the cards 90 and 91 is prevented by a stop member 108. The actual travel is accommodated with holes 109 and 110 in cards 90 and 91 and in hole 111 in the intermediate card 92 through which screw 100 passes, being provided with clearance.

In building a structure of the type of FIG. 7 the pressure station 95 can be made in several sections for single positioning of the assembly, or, the assembly can be moved as each sub-unit is assembled.

As packing density increases it is, under certain circumstances, advantageous to introduce flexibility into the card at the portion thereof where it is connected to the intermediate card. The flexibility provides the advantages of permitting positioning of the card with respect to the adjacent and intermediate cards to accommodate air flow, component size and packing arrangements.

Figure 10:
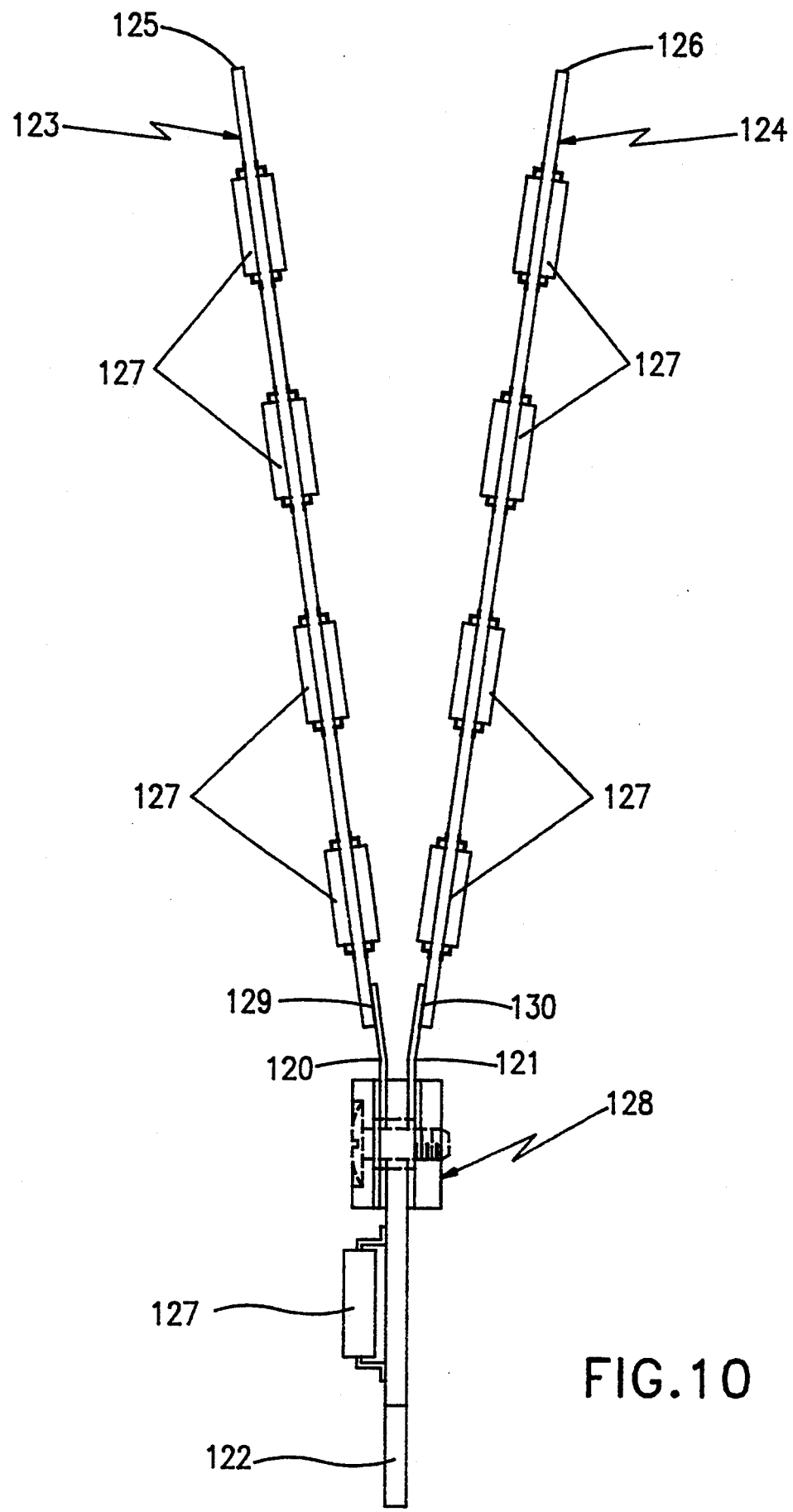
FIG. 10 is a schematic cross sectional view of a flexible region in a two card with the intermediate card, assembly of the invention.

Referring to FIG. 10, the use of flexibility is illustrated for the types of two card with intermediate card assemblies of FIGS. 2, 6 and 8. The flexibility is achieved by providing deformation regions 120 and 121 each positioned between the intermediate card 122 and at least one of cards 123 and 124. The deformation regions 120 and 121 permit movement in the thickness direction, of the cards, thereby permitting the portions thereof 125 and 126 respectively to change position and in turn achieving such benefits as component 127 size accommodation between cards and airflow around the cards, while retaining conductor and contact registration in the other dimensions. The deformation regions 120 and 121 support the conductors in the areas between the cards 123 and 124 and the contacts inside the attachment member 128, which in turn may be of the bolt, and rail type shown with FIGS. 8 and 9.

It will be apparent to one skilled in the art that within the principles set forth many variations are possible. As examples, elements 120 and 121 can be thin conductor bearing members, the conductors of which are bonded to the conductors of cards 123 and 124 at locations 129 and 130, or the material of cards 123 and 124 can be made thin, made of flexible material or have localized flexibility introduced.

What has been described is an interconnecting structural principle wherein an assembly of an intermediate card and a circuitry and componentry bearing card or cards provides packaging density and wiring flexibility. The assembly is put together employing substantially orthogonal retention and wiping forces.

Having thus described our invention, what we claim as new and desire to secure by Letters Patent is:

1. An electrical packaging structure comprising:
a first substrate having electrical contact locations in the vicinity of an edge thereof,
a second substrate having electrical contact locations in the vicinity of an edge thereof,
a third substrate having a first and a second side and with electrical contact locations on both said first and said second sides in the vicinity of a first edge thereof,
said contact locations on said first substrate being disposed against said contact locations on said first side of said third substrate,
said contact locations on said second substrate being disposed against said contact locations on said second side of said third substrate and,
a fourth substrate having a socket thereon into which a second edge of said third substrate is inserted.

2. The structure of claim 1 further including retention means providing continuous compressive force on said contact locations on said first, said second and said third substrates disposed against each other.

3. The structure of claim 2 wherein said retention means includes rails positioned essentially parallel to said contact locations on said first, second and third substrates and said rails being joined to each other by screw members that pass through the combination of said first, second and third substrates.

4. In the packaging of electrical componentry and circuitry mounted on planar cards having in the vicinity of an edge thereof spaced contacts, with electrical connections from those contacts to external circuitry through spaced conductors on a planar supporting member, the improvement comprising:
at least one intermediate card positioned between said planar cards and said supporting member,
each said intermediate card having at least along a first edge thereof a row of contacts with the spacing of said spaced contacts on said planar cards,
each said intermediate card having at least along a second edge thereof a row of contacts with spacing corresponding to the spacing of the conductors on said supporting member, and,
each said intermediate card having an area supporting at least one of componentry and circuitry and providing circuitry between said row of contacts along said first edge and said row of contacts along said second edge.

5. An electrical packaging assembly structure comprising in combination:
a first componentry and circuitry supporting planar card having contacts thereto in a row along one edge,
a second componentry and circuitry supporting planar card having contacts thereto in a row along one edge,
an intermediate card having opposing rows of contacts along a first edge and at least one row of contacts along a second edge essentially parallel to said first edge,
said first and second componentry and circuitry cards being positioned and retained on each side of said intermediate card with said row of contacts on each in contact with one row of said opposing rows of contacts on said intermediate card, and,
a substrate supported socket engaging and retaining said contacts along said second edge of said intermediate card.

6. The structure of claim 5 wherein said first and second componentry and circuitry cards with said intermediate card therebetween are retained by rail members with mechanical fastening members passing through said cards joining said rails and exerting compressive force on said contacts.

7. The structure of claim 6 including a compliant member between each rail and card.

8. The process of assembly of planar componentry and circuitry cards each having at least one row of contacts along an edge thereof into an independent subassembly unit of two cards comprising serially the steps of:
positioning the contacts in a row of a first card of said unit against the contacts in a row of a second card,
applying compressive force urging the contacts of said first card against the contacts of said second card,
providing wiping motion of the contacts of said first card on the contacts of said second card, and
retaining the contacts of said first and second cards against each other.

9. The process of claim 8 wherein said providing motion step includes providing a movement inducing force to one card that is in an orthogonal direction to the direction of said compressive force.

10. The process of claim 9 wherein said step of retaining the contacts against each other includes permanent force in the direction of said compressive force.

11. In the packaging of electrical componentry and circuitry of the type mounted on at least one planar card with contacts thereto positioned on the edge of the card, the improvement comprising:
the assembly of at least one planar card,
an intermediate card having first and second rows of contacts along essentially parallel edges with at least one of componentry and circuitry on an area of said intermediate card between said first and said second rows,
said first row of contacts being on at least one side of said card and spaced compatible with said contacts on the edge of each said at least one planar card, and,
said second row of contacts being spaced compatible with the contact spacing in a socket connected to external wiring,
means for retaining said contacts in said first row on said intermediate card in contact with said contacts on the edge of each said planar card, and,
wherein in each said at least one planar card there is a deformation region at least in the portion thereof proximate to the contacts on said planar card edge.

12. Assembly apparatus for performing a contacting and retention operation between at least one row of contacts on a first planar componentry and circuit bearing card with at least one row of contacts on a second planar componentry and circuit bearing card, comprising:
at least one compressive force applicator adapted to apply force across rows of contacts in the direction of the thickness dimension of said cards, and, a second force applicator adapted to apply force along the direction of the planar dimension of said cards and operable to provide a wiping motion of said rows of contacts while said rows of contacts are under compressive force in said compressive force applicator.

13. An electrical packaging structure comprising in combination:

a first assembly of a first componentry and circuitry supporting planar card having contacts thereto in a row along one edge, a second componentry and circuitry supporting planar card having contacts thereto in a row along one edge, and, a first intermediate card having opposing rows of contacts along a first edge and at least one row of contacts along a second edge essentially parallel to said first edge, said first and second componentry and circuitry cards being positioned and retained on each side of said first intermediate card with said row of contacts on each in contact with one row of said opposing rows of contacts on said first intermediate card, a second assembly of a third componentry and circuitry supporting planar card having contacts thereto in a row along one edge, a fourth componentry and circuitry supporting planar card having contacts thereto in a row along one edge, and, a second intermediate card having opposing rows of contacts along a first edge and at least one row of contacts along a second edge essentially parallel to said first edge, said third and fourth componentry and circuitry cards being positioned and retained on each side of said intermediate card with said row of contacts on each in contact with one row of said opposing rows of contacts on said second intermediate card, each of said first and second intermediate cards in said assemblies being positioned on one side of a third intermediate card, said third intermediate card having opposing rows of contacts along a first edge and at least one row of contacts along a second edge essentially parallel to said first edge, each of said opposing rows of contacts on said third intermediate card being in contact with one said row of contacts along said second edge of each of said first and second intermediate cards positioned on each side of said third intermediate card, and, a substrate supported socket engaging and retaining said row of contacts along said second edge of said third intermediate card.

* * * * *